United States Patent
Shibazaki (10) Patent No.: US 8,792,079 B2
(45) Date of Patent: Jul. 29, 2014

(54) EXPOSURE APPARATUS, EXPOSURE METHOD, AND DEVICE MANUFACTURING METHOD HAVING ENCODERS TO MEASURE DISPLACEMENT BETWEEN OPTICAL MEMBER AND MEASUREMENT MOUNT AND BETWEEN MEASUREMENT MOUNT AND MOVABLE BODY

(75) Inventor: Yuichi Shibazaki, Kumagaya (JP)

(73) Assignee: Nikon Corporation, Tokyo (JP)

( * ) Notice: Subject to any disclaimer, the term of this patent is extended or adjusted under 35 U.S.C. 154(b) by 850 days.

(21) Appl. No.: 12/343,881

(22) Filed: Dec. 24, 2008

(65) Prior Publication Data
US 2009/0201513 A1    Aug. 13, 2009

Related U.S. Application Data

(60) Provisional application No. 61/006,820, filed on Jan. 31, 2008.

(30) Foreign Application Priority Data

Dec. 28, 2007   (JP) .................. 2007-340275

(51) Int. Cl.
*G03B 27/52* (2006.01)
*G01B 11/00* (2006.01)
*G01B 11/14* (2006.01)
*G01D 5/347* (2006.01)
*G03F 7/20* (2006.01)

(52) U.S. Cl.
CPC ............... *G01B 11/00* (2013.01); *G01B 11/14* (2013.01); *G01D 5/34715* (2013.01); *G01D 5/34746* (2013.01); *G03F 7/70775* (2013.01); *G03F 7/70833* (2013.01)
USPC ........................................... 355/55; 356/616

(58) Field of Classification Search
CPC .................... G03F 7/70775; G01D 5/34746
USPC .................. 356/616; 355/52, 67, 53
See application file for complete search history.

(56) References Cited

U.S. PATENT DOCUMENTS

| | | | |
|---|---|---|---|
| 5,448,332 | A | 9/1995 | Sakakibara et al. |
| 5,493,403 | A | 2/1996 | Nishi |
| 5,610,715 | A | 3/1997 | Yoshii et al. |
| 6,611,316 | B2 | 8/2003 | Sewell |

(Continued)

FOREIGN PATENT DOCUMENTS

| | | |
|---|---|---|
| JP | A 4-65603 | 3/1992 |
| JP | A 6-283403 | 10/1994 |

(Continued)

OTHER PUBLICATIONS

Written Opinion dated Mar. 9, 2009 (mailed Mar. 24, 2009) in PCT Application No. PCT/JP2008/003955 (with translation).

(Continued)

*Primary Examiner* — Chia-how Michael Liu
(74) *Attorney, Agent, or Firm* — Oliff PLC (57) ABSTRACT

An x linear encoder, which is configured of a pickup placed on a measurement mount and facing an x scale fixed on the lower surface of a barrel that houses a projection optical system, measures the displacement of the barrel with the measurement mount serving as a reference. With the configuration of the x linear encoder, a path of a measurement light that propagates back and forth between the pickup and the scale is significantly shortened, compared with the case of using an interferometer.

24 Claims, 5 Drawing Sheets

(56) References Cited

U.S. PATENT DOCUMENTS

| | | |
|---|---|---|
| 6,778,257 B2 | 8/2004 | Bleeker et al. |
| 7,023,610 B2 | 4/2006 | Ohtsuki et al. |
| 7,161,659 B2 | 1/2007 | Van Den Brink et al. |
| 7,238,931 B2 | 7/2007 | Nabeshima et al. |
| 7,253,875 B1 | 8/2007 | Luttikhuis et al. |
| 7,333,174 B2 | 2/2008 | Koenen et al. |
| 2006/0139660 A1 | 6/2006 | Patrick Kwan |
| 2006/0227309 A1 | 10/2006 | Loopstra et al. |
| 2007/0047876 A1 | 3/2007 | Kwan et al. |
| 2007/0052976 A1 | 3/2007 | Pril et al. |
| 2007/0076218 A1 | 4/2007 | Van Empel et al. |
| 2007/0195296 A1 | 8/2007 | Van Der Pasch et al. |
| 2007/0263191 A1 | 11/2007 | Shibazaki |
| 2007/0263197 A1 | 11/2007 | Luttikhuis et al. |
| 2007/0288121 A1 | 12/2007 | Shibazaki |
| 2008/0043212 A1 | 2/2008 | Shibazaki |
| 2008/0088843 A1 | 4/2008 | Shibazaki |
| 2008/0094592 A1 | 4/2008 | Shibazaki |
| 2008/0094593 A1 | 4/2008 | Shibazaki |
| 2008/0094604 A1 | 4/2008 | Shibazaki |
| 2008/0106722 A1 | 5/2008 | Shibazaki |
| 2008/0212083 A1 | 9/2008 | Kwan |
| 2008/0218713 A1 | 9/2008 | Shibazaki |

FOREIGN PATENT DOCUMENTS

| | | |
|---|---|---|
| JP | A-2006-210858 | 8/2006 |
| JP | A-2006-250587 | 9/2006 |
| JP | A-2007-129202 | 5/2007 |
| JP | A-2007-251156 | 9/2007 |
| JP | A-2007-528125 | 10/2007 |
| JP | A-2007-311597 | 11/2007 |
| WO | WO 99/49504 A1 | 9/1999 |
| WO | WO 01/35168 A1 | 5/2001 |
| WO | WO 2005/081060 A2 | 9/2005 |
| WO | WO 2006/128713 A2 | 7/2006 |

OTHER PUBLICATIONS

Nov. 22, 2012 Office Action issued in Japanese Patent Application No. 2009-547896 (with translation).

Notification of Reason(s) for Rejection dated Dec. 18, 2013 from Japanese Patent Application No. 2013-005090 (with English-language translation).

EXPOSURE APPARATUS, EXPOSURE METHOD, AND DEVICE MANUFACTURING METHOD HAVING ENCODERS TO MEASURE DISPLACEMENT BETWEEN OPTICAL MEMBER AND MEASUREMENT MOUNT AND BETWEEN MEASUREMENT MOUNT AND MOVABLE BODY

CROSS-REFERENCE TO RELATED APPLICATIONS

This non-provisional application claims the benefit of Provisional Application No. 61/006,820 filed Jan. 31, 2008, the disclosure of which is hereby incorporated herein by reference in its entirety.

BACKGROUND OF THE INVENTION

1. Field of the Invention

The present invention relates to exposure apparatuses, exposure methods and device manufacturing methods, and more particularly to an exposure apparatus and an exposure method that form a pattern on an object with an energy beam, and a device manufacturing method that uses the exposure apparatus or the exposure method.

2. Description of the Background Art

In a lithography process for manufacturing electron devices such as semiconductor devices (integrated circuits and the like) and liquid crystal display devices, an exposure apparatus such as a projection exposure apparatus by a step-and-repeat method (a so-called stepper) or a projection exposure apparatus by a step-and-scan method (a so-called scanning stepper (which is also called a scanner)) is mainly used.

In this type of exposure apparatus, in general, by using a laser interferometer, the position of a wafer stage that holds a substrate to be exposed such as a wafer or a glass plate (hereinafter, generically referred to as a wafer) is measured with the side surface of a barrel of a projection optical system serving as a reference, and position control of the stage with respect to the projection optical system is performed using the measurement results (e.g. refer to U.S. Patent Application Publication No. 2007/0288121). Accordingly, even if the position of the projection optical system finely varies due to vibration or the like, the wafer stage can be made to follow the positional variation with high precision.

However, in the case where the laser interferometer is used to measure the position of the wafer stage with the barrel side surface of the projection optical system serving as a reference, the optical path length of the measurement beam becomes as long as around several hundreds mm or more. Therefore, an error occurs in the measurement values in some cases due to temperature fluctuations (air fluctuations) of the atmosphere generated around the optical path of the measurement beam, and this error becomes a factor of positional deviation of patterns formed on the wafer and overlay error between patterns of a plurality of layers that are layered and formed on the wafer.

SUMMARY OF THE INVENTION

According to a first aspect of the present invention, there is provided a first exposure apparatus that exposes an object with an energy beam via an optical member and forms a pattern on the object, the apparatus comprising: a movable body that moves along a predetermined plane, while holding the object; a holding member that holds the optical member; and a first encoder that measures a distance between a predetermined reference position and the holding member in a first axis direction parallel to the plane.

With this apparatus, a distance in the first direction from the reference position to the holding member that holds the optical member is measured by the first encoder. Accordingly, it becomes possible to measure the distance from the reference position to the optical member with high precision, even if the change in the atmosphere such as temperature fluctuations occurs on the periphery of the first encoder and the holding member. Consequently, it becomes possible to move or position the movable body with high precision with the optical member serving as reference.

According to a second aspect of the present invention, there is provided a second exposure apparatus that exposes an object with an energy beam via an optical member, the apparatus comprising: a movable body that can move within a predetermined plane, while holding the object; a holding member that holds the optical member; an encoder device that has a scale arranged on one of the optical member and the holding member and a head arranged on the other, and measures positional information of the optical member in a direction parallel to the predetermined plane.

With this apparatus, the encoder device that has the scale arranged on one of the optical member and the holding member and the head arranged on the other measures positional information of the optical member in a direction parallel to the predetermined plane. Accordingly, it becomes possible to measure positional information of the optical member with high precision, even if the change in the atmosphere such as temperature fluctuations occurs on the periphery of the holding member.

According to a third aspect of the present invention, there is provided a device manufacturing method, comprising: a process of forming a pattern on an object by using one of the first and second exposure apparatuses of the present invention; and a process of developing the object on which the pattern has been formed.

According to a fourth aspect of the present invention, there is provided a first exposure method of exposing an object with an energy beam via an optical member and forming a pattern on the object, the method comprising: a first measurement process of measuring a positional relation between the optical member and a predetermined reference position within a movement plane of a movable body that moves holding the object, by using an encoder system.

With this method, the positional relation between the optical member and the predetermined reference position within a movement plane of the movable body that moves holding the object is measured by using the encoder system. Accordingly, it becomes possible to measure the positional relation between the optical member and the predetermined reference position within the movement plane of the movable body. Consequently, it becomes possible to move or position the movable body with high precision with the optical member serving as reference.

According to a fifth aspect of the present invention, there is provided a second exposure method of exposing an object held by a movable body that can move within a predetermined plane, with an energy beam via an optical member, the method comprising: a process of, by using an encoder device that has a scale arranged on one of the optical member and a holding member that holds the optical member and a head arranged on the other, measuring positional information of the optical member in a direction parallel to the predetermined plane.

With this method, by using the encoder device that has the scale arranged on one of the optical member and the holding member and the head arranged on the other, positional information of the optical member in a direction parallel to the predetermined plane is measured. Accordingly, it becomes possible to measure the positional information of the optical member with high precision, even if the change in the atmosphere such as temperature fluctuations occurs on the periphery of the holding member.

According to a sixth aspect of the present invention, there is provided a device manufacturing method, comprising: a process of forming a pattern on an object by using one of the first and second exposure methods of the present invention; and a process of developing the object on which the pattern has been formed.

BRIEF DESCRIPTION OF THE DRAWINGS

In the accompanying drawings.

DESCRIPTION OF THE EMBODIMENTS

An embodiment of the present invention is described below, with reference to FIGS. 1 to 5.

Figure 1:
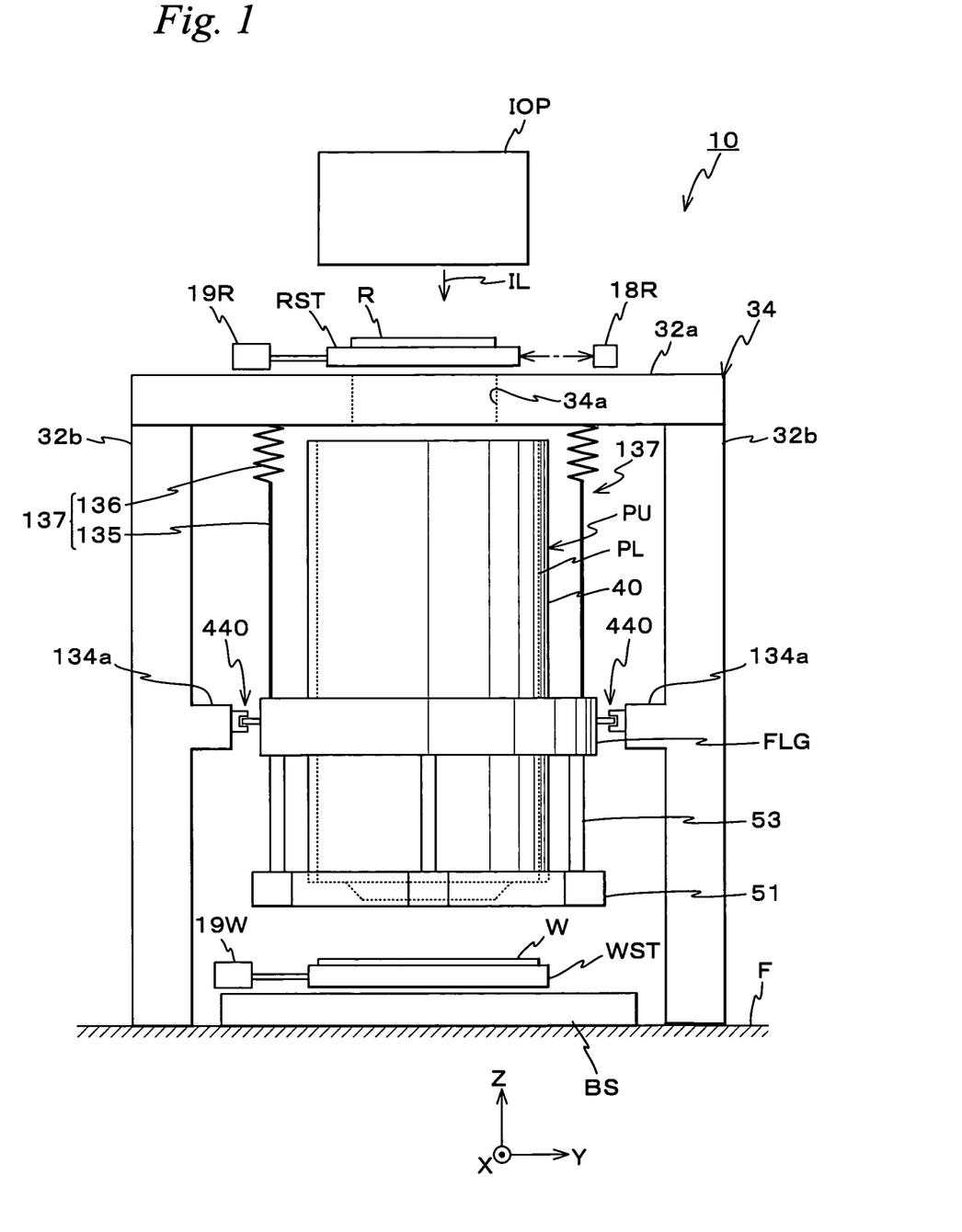
FIG. 1 is a schematic view showing an exposure apparatus related to an embodiment.

FIG. 1 shows a schematic configuration of an exposure apparatus 10 of the embodiment. Exposure apparatus 10 is a projection exposure apparatus by a step-and-scan method, which is a so-called scanning stepper. As is described later, a projection optical system PL is arranged in the embodiment, and in the description below, the explanation is given assuming that an optical axis direction of projection optical system PL is a Z-axis direction, a direction in which a reticle and a wafer are relatively scanned within a plane orthogonal to the Z-axis direction is a Y-axis direction, and a direction that is orthogonal to a Z-axis and a Y-axis is an X-axis direction, and rotation (inclination) directions about an X-axis, the Y-axis and the Z-axis are θx, θy and θz directions, respectively.

Exposure apparatus 10 is equipped with: an illumination unit IOP, a reticle stage RST that holds a reticle R, a projection unit PU including projection optical system PL, a wafer stage WST that moves within an XY plane while holding a wafer W, and their control system; and a column 34 that holds projection unit PU; and the like.

Illumination unit IOP includes a light source and an illumination optical system, and irradiates a rectangular or circular arc illumination area that is defined by a field stop (which is also called a masking blade or a reticle blind), which is placed inside illumination unit IOP, with an illumination light IL, and illuminates reticle R on which a circuit pattern is formed with uniform illuminance. As illumination light IL, an ArF excimer laser light (wavelength: 193 nm) is used, as an example.

Reticle stage RST is placed above a reticle stage base 32a that constitutes a top board of column 34 (to be described later), and is supported by levitation above reticle stage base 32a by a magnetic levitation force that is generated by, for example, a magnetic levitation type two-dimensional linear actuator that constitutes a reticle stage drive system 19R. And, on reticle stage RST, reticle R is fixed by, for example, vacuum suction or electrostatic suction.

Reticle stage RST is driven with a predetermined stroke in the Y-axis direction (a lateral direction of the page surface of FIG. 1), and finely driven also in the X-axis direction (an orthogonal direction to the page surface of FIG. 1) and the θz direction, and further finely driven also in the Z-axis direction and inclination directions (the θx direction and the θy direction) with respect to the XY plane, by reticle stage drive system 19R.

The position (including the rotation in the θz direction) of reticle stage RST (reticle R) within the XY plane is constantly detected at a resolution of, for example, around 0.25 to 1 nm with a reticle laser interferometer (herein after, referred to as a "reticle interferometer") 18R that irradiates a reflection surface fixed (or formed) on reticle stage RST with a laser beam. And, the position of reticle R in the Z-axis direction is measured by a reticle focus sensor RF (not shown in FIG. 1, refer to FIG. 5) that is composed of a multipoint focal position detecting system that is disclosed in, for example, U.S. Pat. No. 5,448,332.

Figure 5:
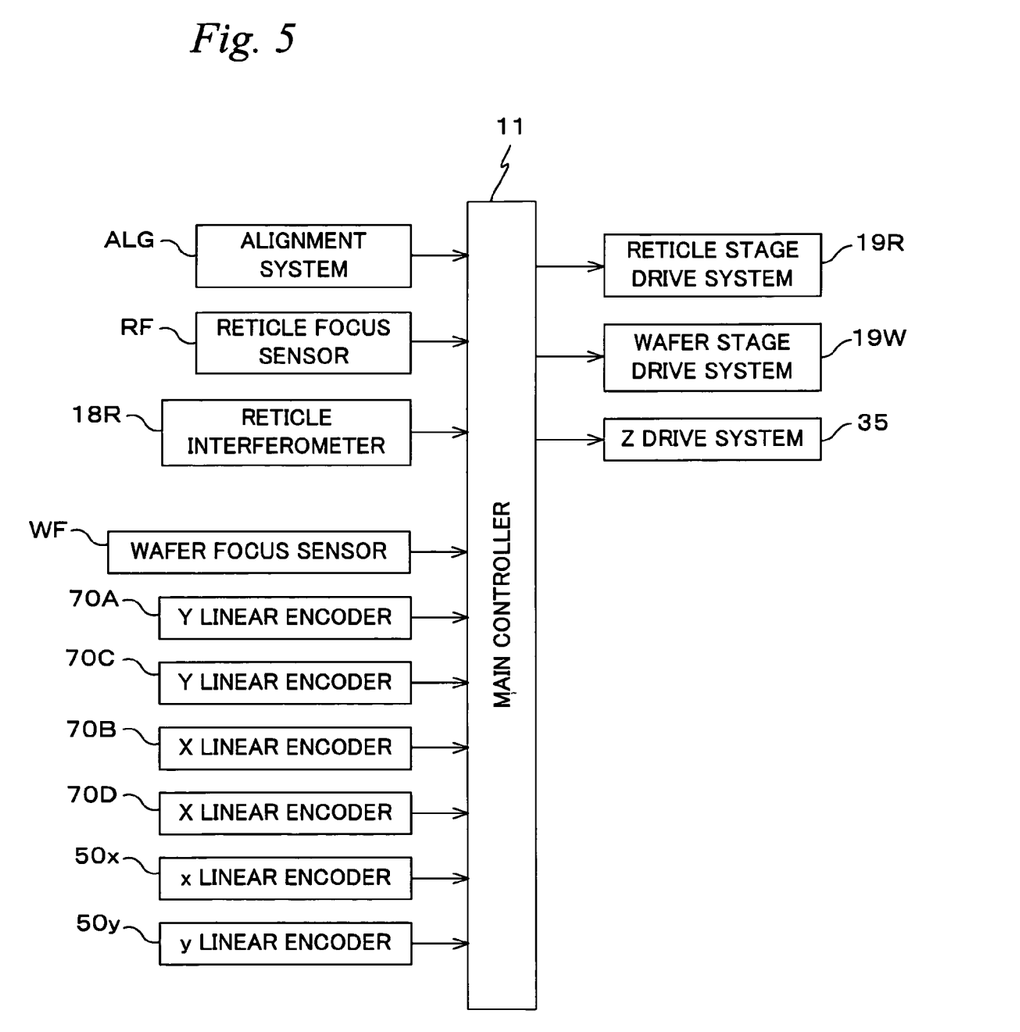
FIG. 5 is a block diagram showing a control system of the embodiment.

The measurement values of reticle interferometer 18R and reticle focus sensor RF are supplied to a main controller 11 (refer to FIG. 5). Main controller 11 drives reticle stage RST via reticle stage drive system 19R based on the supplied measurement values.

Projection unit PU referred to above has a barrel 40 having a cylindrical shape, and projection optical system PL composed of a plurality of optical elements held in barrel 40. In the embodiment, barrel 40 is a single barrel, but for example, barrel 40 can be configured layering a plurality of barrels each of which holds one or a plurality of optical element (s). In this case, it is preferable that the plurality of barrels are housed in a sealed member and the cleaning level of projection optical system PL is maintained at a high level.

As projection optical system PL described above, for example, a dioptric system that is composed of a plurality of optical elements (lens elements) that are disposed along the optical axis parallel to the Z-axis direction is used. Projection optical system PL is, for example, both-side telecentric and has a predetermined projection magnification (e.g. one-quarter, or one-fifth). Therefore, when the illumination area described previously is illuminated by illumination light IL from illumination unit IOP, illumination light IL having passed through reticle R whose pattern surface is placed almost coincident with a first plane (an object plane) of projection optical system PL forms a reduced image of a circuit pattern (a reduced image of a part of a circuit pattern) of reticle R within the illumination area onto an area (an exposure area) that is conjugate to the illumination area described above on wafer W, which is placed on a second plane (an image plane) side of projection optical system PL and whose surface is coated with a resist (a sensitive agent), via projection optical system PL.

Then, by moving reticle R in the scanning direction (the Y-axis direction) relative to the illumination area (Illumination light IL) and also moving wafer W in the scanning direction (the Y-axis direction) relative to the exposure area (illumination light IL) by synchronous drive of reticle stage RST and wafer stage WST, scanning exposure of one shot area (divided area) on wafer W is performed, and a pattern of reticle R is transferred to the shot area. More specifically, in the embodiment, a pattern is generated on wafer W by illumination unit IOP, reticle R and projection optical system PL, and the pattern is formed on wafer W by exposure of a sensitive layer (resist layer) on wafer W with illumination light IL.

Column 34 includes a plurality (e.g. three in this case) of leg sections 32b (the leg section on the side of depth of the page surface is not shown) and reticle stage base 32a that is supported above a floor surface F by leg sections 32b. In the center portion of reticle stage base 32a, an opening 34a having a rectangular shape in a planar view (when viewed from above) that penetrates in the vertical direction (the Z-axis direction) is formed.

Barrel 40 is, for example, a hollow member having a cylindrical shape with the Z-axis direction serving as its longitudinal direction that houses projection optical system PL, and a protruding section is formed in the center of the bottom wall. Inside the protruding section, an optical member that is located at the lower end of projection optical system PL is held, and in the center of the protruding section, an opening section that serves as a path of an illumination light is formed. This is not intended to be limiting, and the bottom wall of barrel 40 is configured of a plate member having a circular opening formed in the center portion, and a holding member that holds the optical member located at the lower end of projection optical system PL can be made to protrude from the circular opening.

Further, on the outer periphery at the position that is slightly lower than the center in the height direction of barrel 40, a flange FL having a ring shape is integrally arranged.

Flange FL is supported by a plurality, e.g. three of suspension support mechanisms 137 (however, the suspension support mechanisms on the side of depth of the page surface is not shown) whose one ends are fixed to the lower surface side of reticle stage base 32a, thus barrel 40 is supported in a suspended state below reticle stage base 32a. Each suspension support mechanism 137 includes, for example, a coil spring 136 that is a connecting member having a flexible structure and a wire 135. Coil spring 136 oscillates like a pendulum in a direction perpendicular to the optical axis (the Z-axis) of projection optical system PL, and isolates vibration in the direction perpendicular to the optical axis of projection optical system PL (i.e. prevents the vibration of the floor from reaching to projection optical system PL). Further, coil spring 136 has a high vibration isolation performance also in a direction parallel to the optical axis. Incidentally, in the case where a barrel platform that supports projection unit PU is provided, the barrel platform can be supported in a suspended state by, for example, three suspension support mechanisms 137.

In the vicinity of the center portion of each of three leg sections 32b of column 34 in the Z-axis direction, a protruding section 134a is formed. Further, between each protruding section 134a and flange FL of projection optical system PL, a drive mechanism 440 is arranged. Each drive mechanism 440 includes a voice coil motor that drives projection optical system PL in a radius direction of barrel 40 and a voice coil motor that drives projection optical system PL in the optical axis direction (the Z-axis direction). By three drive mechanisms 440 (the drive mechanism on the side of depth of the page surface of FIG. 1 is not shown) arranged between three protruding sections 134a and flange FL, projection optical system PL can be driven in directions of six degrees of freedom. In the embodiment, main controller 11 (refer to FIG. 5) controls the drive of the voice coil motors of each drive mechanism 440 so that projection optical system PL is in a stationary state with respect to column 34 and floor surface F, based on, for example, acceleration information that is detected by an acceleration sensor (not shown) arranged on flange FLG of projection optical system PL.

Wafer stage WST is supported by levitation above a stage platform BS, which is placed below projection optical system PL and horizontally installed on floor surface F, via a plurality of noncontact bearings, for example, air bearings arranged on its bottom surface. On wafer stage WST, wafer W is held by vacuum suction (or electrostatic suction) via a wafer holder (not shown).

Figure 2A:
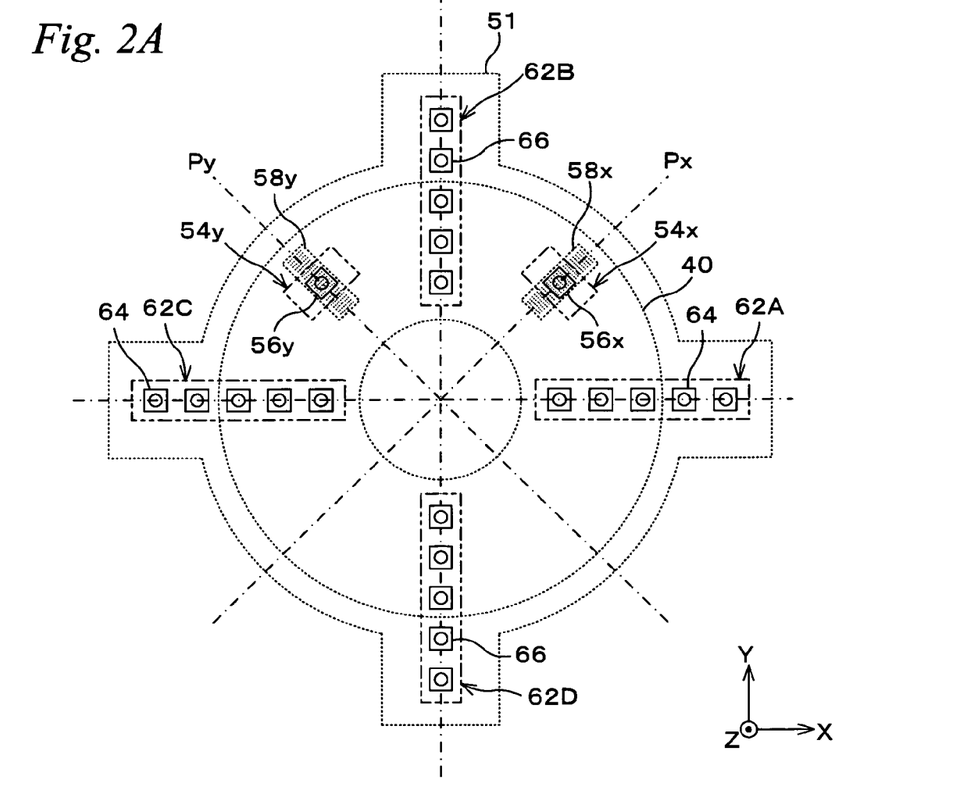
FIG. 2A is a view used to explain an arrangement of head units and pickups.
Figure 2B:
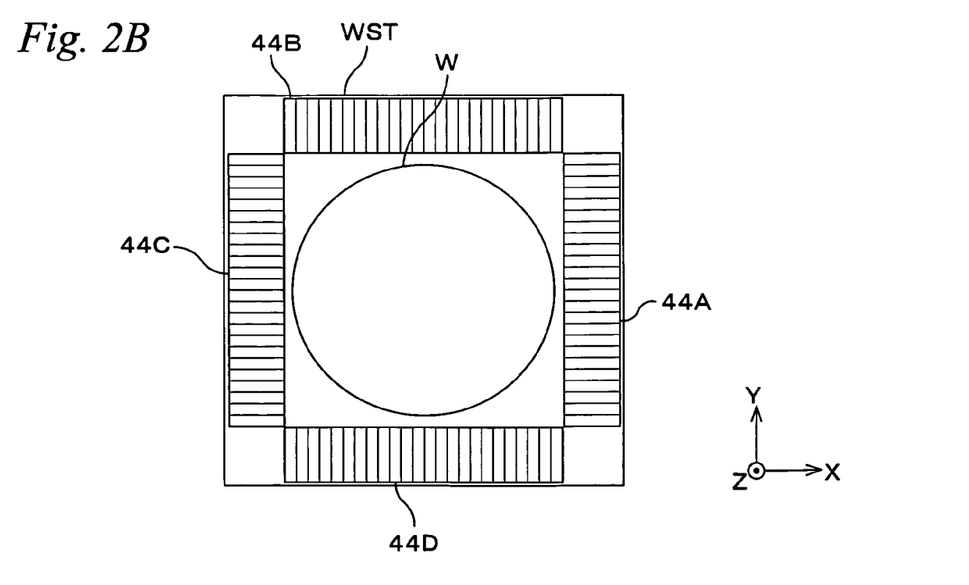
FIG. 2B is a plan view showing a wafer stage.

The position of wafer stage WST is measured by the encoder system that is disclosed in, for example, U.S. Patent Application Publications No. 2007/0288121, No. 2008/0088843, No. 2006/0227309, and the like. In the embodiment, the encoder system has four linear encoders 70A to 70D (refer to FIG. 5), and as shown in FIG. 2A, four encoder head units 62A to 62D are placed on the lower surface of a measurement mount (holding member) 51 (the details will be described later on). Meanwhile, as shown in FIG. 2B, a pair of Y scales 44A and 44C with the Y-axis direction serving as their longitudinal directions and a pair of X scales 44B and 44D are fixed to the upper surface of wafer stage WST, respectively, so as to enclose wafer W. On the surface of each of scales 44A to 44D, a reflective type diffraction grating having a periodic direction in each longitudinal direction is formed.

The surface on the +Z side (the upper surface) of stage platform BS is processed so as to have a very high flatness degree, and serves as a reference surface (a guide surface) during movement of wafer stage WST. Wafer stage WST is driven with a predetermined stroke in the Y-axis direction, and finely driven also in the X-axis direction and the θz direction, and further, finely driven also in the Z-axis direction and the inclination directions (the θx direction and the θy direction) with respect to the XY plane, by a wafer stage drive system 19W.

Measurement mount 51 is supported in a suspended state by flange FLG of projection optical system PL via a plurality (e.g. four, in this case) of support members 53 (however, the support member on the side of depth of the page surface is not shown). Each support member 53 is actually configured including a link member having a flexure section at both ends. Each flexure section has high rigidity in the longitudinal direction (the Z-axis direction) of the support member, and has low rigidity in other directions of five degrees of freedom. Accordingly, measurement mount 51 is supported by the four support members while hardly generating a reaction force between measurement mount 51 and flange FLG.

Figure 3:
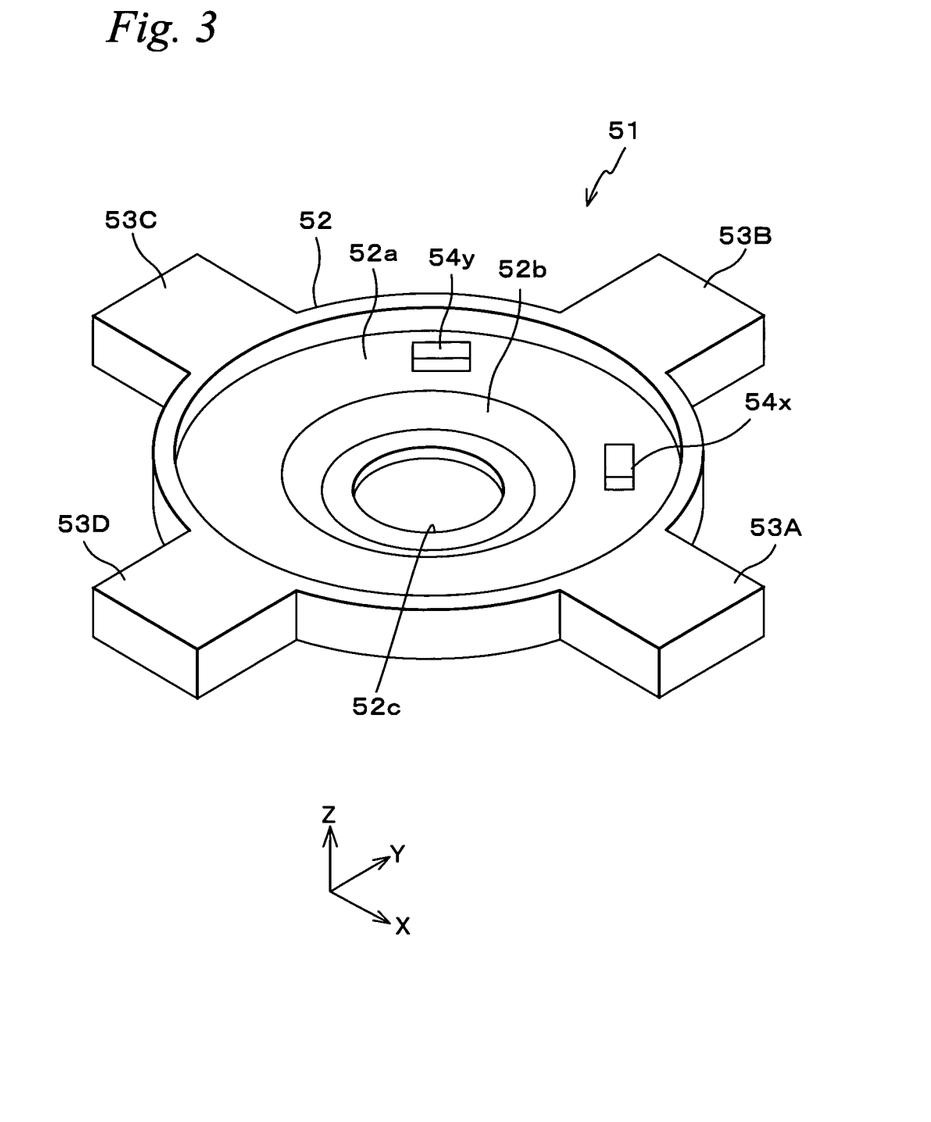
FIG. 3 is a perspective view showing a measurement mount.

As shown in a perspective view of FIG. 3, measurement mount 51 has a main section 52 having a circular plate shape, and four extending sections 53A, 53B, 53C and 53D each having a roughly square shape in a planar view that are arranged protruding in the +X direction, the +Y direction, the −X direction and the −Y direction, respectively, from main section 52.

Of main section 52, a section (an inner circular section) that excludes a rim section having a ring shape on the outer circumferential edge of the upper surface is a recessed section 52a whose inner bottom surface is lower than the rim section. And, in the center of recessed section 52a, an annular surface area that is slightly lower than the inner bottom surface of recessed section 52a and is parallel to the upper surface is formed. The inner circumferential edge and the outer circumferential edge of the annular surface area and the rim section described previously are concentric. The inner circumferential edge of the surface area serves as the inner circumferential surface of a circular opening 52c. The surface area and the inner bottom surface of recessed section 52a are coupled by a taper slope. The surface area around circular opening 52c and the taper slope form a housing section 52b.

As shown in FIGS. 2 and 3, on the inner bottom surface of recessed section 52a of measurement mount 51, a pickup 54x and a pickup 54y are placed, which serve as sensor head sections of linear encoders 50x and 50y (refer to FIG. 5) to be described later on.

As shown in FIG. 2A, pickup 54x is placed on a straight line Px, and is equipped with an x head 56x that irradiates a light upward (in +Z direction). Similarly, pickup 54y is placed on a straight line Py, and is equipped with a y head 56y that irradiates a light upward.

Figure 4:
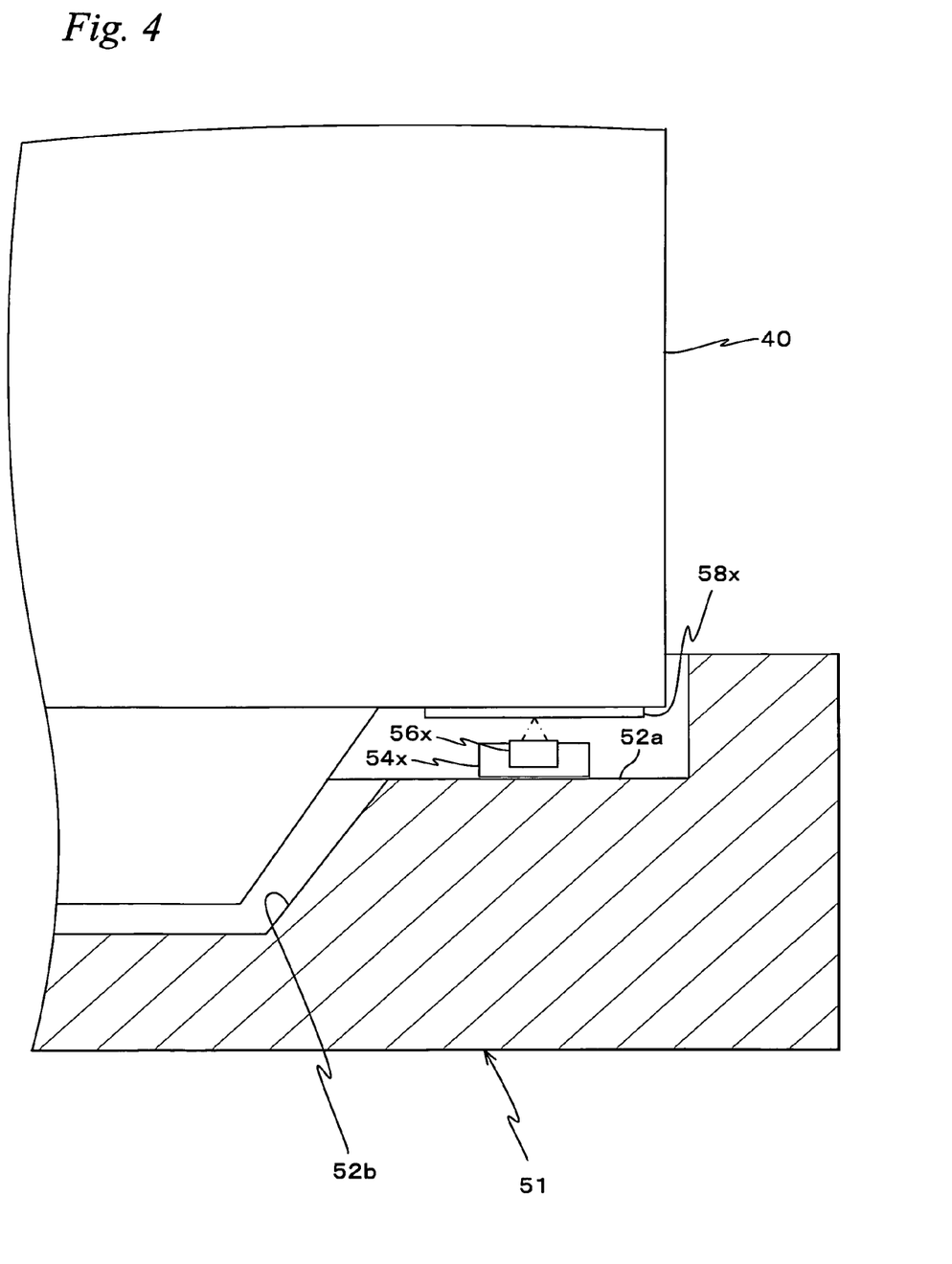
FIG. 4 is a view used to explain an arrangement of the pickups and scales arranged on a barrel.

On the lower surface (the surface on the −Z side) of projection unit PU, for example, on the lower surface of barrel 40, an x scale 58x and a y scale 58y are fixed facing pickups 54x and 54y respectively, as representatively shown by x scale 58x in FIG. 4.

As shown in the arrangement view of FIG. 2A, x scale 58x is placed on straight line Px that is orthogonal to the optical axis of projection optical system PL and is angled at 45 degrees with respect to the X-axis, with a direction parallel to straight line Px serving as its longitudinal direction, and y scale 58y is placed on straight line Py that is orthogonal to the optical axis of projection optical system PL and is angled at 45 degrees with respect to the Y-axis, with a direction parallel to straight line Py serving as its longitudinal direction. Further, on the lower surface (the surface on the −Z side) of each of scales 58x and 58y, a reflective type diffraction grating having a periodic direction in the longitudinal direction is formed.

Pickup 54x constitutes an x linear encoder 50x (refer to FIG. 5) by an optical method that detects the displacement of barrel 40 (projection optical system PL) in a direction parallel to straight line Px, which is caused by, for example, vibration, by using a reflected light (a diffracted light from the diffraction grating) obtained by irradiating x scale 58x fixed to the lower surface of barrel 40 with a light. Similarly, pickup 54y constitutes a y linear encoder 50y (refer to FIG. 5) by an optical method that detects the displacement of barrel 40 (projection optical system PL) in a direction parallel to straight line Py, by using a reflected light (a diffracted light from the diffraction grating) obtained by irradiating y scale 58y fixed to the lower surface of barrel 40 with a light.

In this case, in x linear encoder 50x and y linear encoder 50y, a diffraction interference type head, which has a configuration similar to the configuration of the encoder head that is enclosed in, for example, U.S. Pat. No. 7,238,931, U.S. Patent Application Publication No. 2007/0288121 and the like, is used as pickups 54x and 54y. However, in this embodiment, in pickups 54x and 54y, a light source and a photodetection system (including a photodetector) are placed outside measurement mount 51 and only (a part of) an optical system including a polarization beam splitter that splits by polarization a light from the light source is placed on the inner bottom surface of recessed section 52a of measurement mount 51, that is, placed facing x scale 58x and y scale 58y. More specifically, all sections of pickups 54x and 54y do not have to be arranged at measurement mount 51. In this case, between the light source and the photodetection system, and the optical system, lights and/or signals are transmitted/received by aerial transmission via an optical fiber (not shown). In the description below, the optical system that is placed on the inner bottom surface of recessed section 52a of measurement mount 51 is referred to as a pickup. Incidentally, members that are placed outside measurement mount 51 are not limited to the light source and the photodetection system, but can be only the light source, or can be only the light source and a photodetection element (sensor).

Further, as shown in FIG. 2A, on the lower surface (the −Z side surface) of measurement mount 51, four encoder head units (hereinafter, also referred to as head units) 62A to 62D are placed so as to enclose the periphery of the lower end of projection optical system PL from four sides.

Head units 62A and 62C described above are respectively placed on the +X side and the −X side of projection unit PU, with the X-axis direction serving as their longitudinal directions, symmetrically with respect to the optical axis of projection optical system PL. And, head units 62B and 62D are respectively placed on the +Y side and the −Y side of projection unit PU, with the Y-axis direction serving as their longitudinal directions, symmetrically with respect to the optical axis of projection optical system PL.

As shown in FIG. 2A, head units 62A and 62C are each equipped with a plurality, in this case, five of Y heads 64 that are placed at a predetermined distance along the X-axis direction. Head unit 62A constitutes a multiple-lens, in this case, five-lens Y linear encoder 70A (refer to FIG. 5) equipped with a plurality of Y heads 64 that measures the position in the Y-axis direction (Y-position) of wafer stage WST, using Y scale 44A described previously on wafer stage WST. Similarly, head unit 62C constitutes a five-lens Y linear encoder 70C (refer to FIG. 5) equipped with five Y heads 64 that measures the Y-position of wafer stage WST, using Y scale 44C described previously.

Further, as shown in FIG. 2A, head units 62B and 62D are each equipped with a plurality, in this case, five of X heads 66 that are placed at a predetermined distance along the Y-axis direction. Head unit 62B constitutes a multiple-lens, in this case, five-lens X linear encoder 70B (refer to FIG. 5) equipped with a plurality of X heads 66 that measures the position in the X-axis direction (X-position) of wafer stage WST, using X scale 44B described previously. Similarly, head unit 62D constitutes a five-lens X linear encoder 70D (refer to FIG. 5) equipped with five X heads 66 that measures the X-position of wafer stage WST, using X scale 44D described previously.

Measurement mount 51 having the configuration as described above is supported in a suspended state with the above-described four support members 53 (however, the support member on the side of depth of the page surface is not shown) whose upper ends are fixed (connected) to flange FLG and whose lower ends are fixed (connected) to extending sections 53A to 53D respectively, and is placed at a position a predetermined distance lower (in the −Z direction) than the lower surface of barrel 40. In this suspended support state, as shown in FIG. 4, the protruding section of the lower end of barrel 40 is housed in housing section 52b formed at measurement mount 51. Further, as shown in FIG. 4, the lower surface of barrel 40 and the inner bottom surface of recessed section 52a face each other via a predetermined gap, x head 56x of pickup 54x and x scale 58x placed on the lower surface of barrel 40 face each other, and y head 56y of pickup 54y and y scale 58y placed on the lower surface of barrel 40 face each other.

Furthermore, an alignment system ALG, a wafer focus sensor WF, and the like (refer to FIG. 5) are attached to measurement mount 51. As alignment system ALG, a sensor by an image processing method can be used, and this sensor by an image processing method is disclosed in, for example, Kokai (Japanese Unexamined Patent Application Publication) No. 04-065603 (the corresponding U.S. Pat. No. 5,493,403). Further, as wafer focus sensor WF, the wafer focus sensor that is disclosed in, for example, Kokai (Japanese Unexamined Patent Application Publication) No. 06-283403 (the corresponding U.S. Pat. No. 5,448,332) can be used.

Incidentally, in the embodiment, since the above-described scales 58x and 58y and head units 62A to 62D, and the like are arranged at measurement mount 51, measurement mount 51 can also be called a metrology frame or the like. Further, in the embodiment, not only scales 58x and 58y but also head units 62A to 62D, alignment system ALG and wafer focus sensor WF are arranged at measurement mount 51, but this is not intended to be limiting, and for example, at least either one of head units 62A to 62D, alignment system ALG and wafer focus sensor WF can be arranged at another member that is separate from measurement mount 51.

FIG. 5 shows the control system of exposure apparatus 10 of the embodiment in a block diagram. The control system shown in FIG. 5 includes a so-called microcomputer (or workstation), which is composed of a CPU (Central Processing Unit), an ROM (Read Only Memory), an RAM (Random Access Memory), and the like, and is mainly configured by main controller 11 that performs overall control of the entire apparatus.

In exposure apparatus 10 having the configuration as described above, wafer stage WST that holds wafer W is located below measurement mount 51 during the exposure operation, Y scales 44A and 44C placed on the upper surface of wafer stage WST face head units 62A and 62C respectively, and X scales 44B and 44D face head units 62B and 62D respectively. And, the position of wafer stage WST in the Y-axis direction is measured by head units 62A and 62C facing Y scales 44A and 44C (Y linear encoders 70A and 70C) and the position of wafer stage WST in the X-axis direction is measured by head units 62B and 62D facing X scales 44B and 44D (X linear encoders 70B and 70D). Further, at the same time, by pickup 54x that faces x scale 58x placed on the lower surface of barrel 40 (y linear encoder 50x) and pickup 54y that faces y scale 58y placed on the lower surface of barrel 40 (y linear encoder 50y), the displacement of barrel 40 in directions parallel to straight line Px and straight line Py, more specifically, the position of barrel 40 within the XY plane is measured. Then, main controller 11 monitors measurement results of Y linear encoders 70A and 70C and X linear encoders 70B and 70D, and measurement results of x linear encoder 50x and y linear encoder 50y, and moves wafer stage WST within the XY plane with barrel 40 serving as a reference.

As is described above, according to exposure apparatus 10 of the embodiment, the displacement of barrel 40 within the XY plane during the exposure operation is measured by pickup 54x placed on measurement mount 51 that faces scale 58x placed on the lower surface of barrel 40 (x linear encoder 50x) and pickup 54y placed on measurement mount 51 that faces scale 58y placed on the lower surface of barrel 40 (y linear encoder 50y). Accordingly, even if the position of barrel 40 within the XY plane slightly varies due to vibration caused by the movement of wafer stage WST and the like, the displacement can be measured with high precision, and consequently, position control of wafer stage WST with the optical axis of projection optical system PL held by barrel 40 serving as a reference can be performed with high precision.

Further, a light (hereinafter, referred to as a measurement light) emitted from pickup 54x or 54y is reflected off X scale 58x or y scale 58y, and propagates back and forth between pickup 54x or 54y and x scale 58x or y scale 58y fixed to barrel 40, and the path of the measurement light is shortened to a level that can be ignored compared with the path of the measurement light in the case of an interferometer. Accordingly, even if air fluctuations occur on the periphery or the like of barrel 40 during exposure, the short-term stability of the measurement values of x linear encoder 50x and y linear encoder 50y can be significantly improved, compared with the case of using the interferometer.

Further, in the embodiment, pickups 54x and 54y that emit the measurement light used for measurement of displacement of barrel 40, and head units 62A to 62D that measure the position of wafer stage WST are both placed at measurement mount 51. Therefore, the positional relation between pickups 54x and 54y, and head units 62A to 62D is maintained constant, and accordingly measurement error that occurs between X linear encoders 70B and 70D and Y linear encoders 70A and 70C that perform measurement with respect to wafer stage WST, and x linear encoder 50x and y linear encoder 50y that perform measurement with respect to barrel 40 can be reduced.

Incidentally, in the embodiment above, the displacement of barrel 40 in directions parallel to straight line Px and straight line Py that are angled at 45 degrees with respect to the X-axis and the Y-axis is measured by x linear encoder 50x and y linear encoder 50y, but this is not intended to be limiting, and the displacement of barrel 40 in the X-axis direction and the Y-axis direction can be measured using the encoders, or the displacement of barrel 40 within the XY plane can be measured by measuring the displacement in arbitrary two different axis directions. More specifically, the longitudinal directions (the measurement directions, the periodic directions/arrangement directions of the diffraction gratings) of scales 58x and 58y are not limited to directions parallel to straight lines Px and Py but may be arbitrary directions.

Further, in the embodiment above, only (a part of) the optical system is placed at measurement mount 51 in order to avoid a heat source, but in the case where the influence of heat can be excluded or the influence of heat does not have to be considered, the light source and/or the photodetection system (including the photodetector) can also be placed at measurement mount 51.

Further, in the embodiment above, pickup 54x of x linear encoder 50x and pickup 54y of y linear encoder 50y are attached to measurement mount 51, but this is not intended to be limiting, and pickups 54x and 54y are attached to barrel 40 and the displacement of barrel 40 with respect to measurement mount 51 can be measured by using scales 58x and 58y attached to measurement mount 51.

Further, in the description above, pickups 54x and 54y or scales 58x and 58y are attached to the lower end surface of projection unit PU (barrel 40), but pickups 54x and 54y or scales 58x and 58y can be fixed to other sections than the lower end surface of projection unit PU (barrel 40).

Further, in the embodiment above, x linear encoder 50x and y linear encoder 50y by the optical method are used for displacement measurement of barrel 40, but the method is not limited thereto, and for example, an encoder by an electromagnetic induction method can also be used.

Further, in the embodiment above, the displacement of barrel 40 is measured by using x linear encoder 50x and y linear encoder 50y respectively equipped with pickups 54x and 54y that receive reflected lights obtained by irradiating the scales with lights, but this is not intended to be limiting, and as an encoder to measure the displacement of barrel 40, for example, an encoder that measures the displacement using transmitted lights that have been transmitted through scales 58x and 58y can be employed.

Further, the encoder can be configured capable of measuring the displacement of barrel 40 not only in two arbitrary different axis directions such as the X-axis and the Y-axis, but, for example, in another direction (such as the θz direction).

Incidentally, in the embodiment above, projection unit PU (projection optical system PL) is supported in a suspended state below reticle stage base 32a by three suspension support mechanisms 137 via flange FLG, but this is not intended to be limiting, and projection unit PU (projection optical system PL) can be supported by the barrel platform that is horizontally supported on the floor surface via the vibration isolation device. In this case, measurement mount 51 can also be supported in a suspended state by the barrel platform. The point is that the positional relation between projection unit PU (projection optical system PL) and the reference position within the XY plane should be measurable by the linear encoders. Further, at least either one of head units 62A to 62D, alignment system ALG and wafer focus sensor WF described earlier can be arranged on the barrel platform independently from measurement mount 51.

Further, in the embodiment, the position measurement of wafer stage WST is performed using the encoder system that includes X linear encoders 70B and 70D and Y linear encoders 70A and 70C, but the method of the position measurement of wafer stage WST is not limited thereto. For example, the position measurement of wafer stage WST can be performed by an interferometer system or an interferometer system and an encoder system. In the interferometer system, the position measurement of the wafer stage does not have to be performed with a projection optical system PL as a reference, and therefore the reflection surface of the measurement beam of the interferometer system does not have to be arranged at projection optical system PL. Incidentally, the exposure apparatus equipped with both the interferometer system and the encoder system is disclosed in, for example, U.S. Patent Application Publications No. 2007/0288121 and No. 2008/0088843, and the like.

Further, in the embodiment above, the case has been exemplified where the encoder system is employed in which the grating sections (Y scales and X scales) are arranged on the wafer table (wafer stage) and the X heads and Y heads are placed outside the wafer stage so as to correspond to the grating sections, but this is not intended to be limiting, and as is disclosed in, for example, U.S. Patent Application Publication No. 2006/0227309 and the like, the encoder heads are arranged on the wafer stage and the grating sections (e.g. grating sections of a two-dimensional grating, or of one-dimensional gratings placed two-dimensionally) are placed outside the wafer stage so as to correspond to the encoder heads. In this case, Z heads that measure the position of the wafer table in the Z-axis direction are also arranged on the wafer stage and the surface of the grating section can be used as a reflection surface to which the measurement beams of the Z heads are irradiated. In such a case, a single head having a function of the encoder head and the Z head can also be used. Further, the grating sections (scales) can be supported by the measurement mount or the barrel platform described earlier, as an example.

Further, in the embodiment above, the case has been described where the present invention is applied to the scanning stepper, but this is not intended to be limiting, and the present invention can also be applied to a static exposure apparatus such as a stepper. Further, the present invention can also be applied to a projection exposure apparatus by a step-and-stitch method that synthesizes a shot area and a shot area.

Further, the magnification of the projection optical system in the exposure apparatus of the embodiment above is not only a reduction system, but also can be either an equal magnifying system or a magnifying system, and projection optical system PL is not only a dioptric system, but also can be either a catoptric system or a catadioptric system, and in addition, the projected image can be either an inverted image or an upright image.

Further, illumination light IL is not limited to the ArF excimer laser light (wavelength: 193 nm), but can be an ultraviolet light such as a KrF excimer laser light (wavelength: 248 nm), or a vacuum ultraviolet light such as an $F_2$ laser light (wavelength: 157 nm). Besides the lights referred to above, an emission line in an ultraviolet range such as a g-line (wavelength: 436 nm) or an i-line (wavelength: 365 nm) that is generated by an extra-high pressure mercury can also be used as illumination light IL. Further, as is disclosed in, for example, U.S. Pat. No. 7,023,610, a harmonic wave, which is obtained by amplifying a single-wavelength laser beam in the infrared or visible range emitted by a DFB semiconductor laser or fiber laser as vacuum ultraviolet light, with a fiber amplifier doped with, for example, erbium (or both erbium and ytterbium), and by converting the wavelength into ultraviolet light using a nonlinear optical crystal, can also be used.

Further, in the embodiment above, illumination light IL of the exposure apparatus is not limited to the light having a wavelength more than or equal to 100 nm, and it is needless to say that the light having a wavelength less than 100 nm can be used. For example, in recent years, in order to expose a pattern less than or equal to 70 nm, an EUV (Extreme Ultraviolet) exposure apparatus that makes an SOR or a plasma laser as a light source generate an EUV light in a soft X-ray range (e.g. a wavelength range from 5 to 15 nm), and uses a total reflection reduction optical system designed under the exposure wavelength (e.g. 13.5 nm) and the reflective mask has been developed. In this apparatus, the arrangement in which scanning exposure is performed by synchronously scanning a mask and a wafer using a circular arc illumination can be considered, and therefore, the present invention can also be applied to such an exposure apparatus. In addition, the present invention can also be applied to an exposure apparatus that uses charged particle beams such as an electron beam or an ion beam.

Moreover, the present invention can also be applied to a liquid immersion exposure apparatus such as the liquid immersion exposure apparatus in which a space between projection optical system PL and a wafer is filled with a liquid (e.g. pure water or the like), which is disclosed in, for example, the pamphlet of International Publication No. 99/49504 and the like.

Further, in the embodiment above, a transmissive type mask (reticle), which is a transmissive substrate on which a predetermined light shielding pattern (or a phase pattern or a light attenuation pattern) is formed, is used. Instead of this reticle, however, as is disclosed in, for example, U.S. Pat. No. 6,778,257, an electron mask (a variable shaped mask) on which a light-transmitting pattern, a reflection pattern, or an emission pattern is formed according to electronic data of the pattern that is to be exposed can also be used.

Further, the present invention can also be applied to an exposure apparatus (lithography system) that forms line-and-space patterns on wafer W by forming interference fringes on wafer W, as is disclosed in, for example, the pamphlet of International Publication No. 2001/035168.

Moreover, the present invention can also be applied to an exposure apparatus that synthesizes two reticle patterns on a wafer via a projection optical system and almost simultaneously performs double exposure of one shot area on the wafer by one scanning exposure, as is disclosed in, for example, U.S. Pat. No. 6,611,316.

Incidentally, an object on which a pattern is to be formed (an object subject to exposure to which an energy beam is irradiated) in the embodiment above is not limited to a wafer, but may be another object such as a glass plate, a ceramic substrate, a film member, or a mask blank.

The use of the exposure apparatus is not limited to the exposure apparatus for manufacturing semiconductor devices, but the present invention can also be widely applied, for example, to an exposure apparatus for liquid crystal display devices that transfers a liquid crystal display device pattern onto a rectangular glass plate, and an exposure apparatus for producing organic ELs, thin-film magnetic heads, imaging devices (such as CCDs), micromachines, DNA chips, and the like. Further, the present invention can be applied not only to an exposure apparatus for producing microdevices such as semiconductor devices, but can also be applied to an exposure apparatus that transfers a circuit pattern onto a glass substrate or silicon wafer to produce a reticle or a mask used in a light exposure apparatus, an EUV exposure apparatus, an X-ray exposure apparatus, an electron-beam exposure apparatus, and the like.

Incidentally, the above disclosures of all the publications, the pamphlets of the International Publications, and specifications of the U.S. Patent Application Publications and the U.S. Patents that are cited in the description above and related to exposure apparatuses and the like are each incorporated herein by reference.

Incidentally, semiconductor devices are manufactured through the following steps: a step where the function/performance design of a device is performed, a step where a reticle is manufactured based on this design step; a step where a wafer is manufactured from silicon materials; a lithography step where a pattern of the mask (reticle) is transferred onto the wafer by the exposure apparatus (pattern formation apparatus) of the embodiment described previously; a development step where the exposed wafer is developed; an etching step where an exposed member of an area other than the area where resist remains is removed by etching; a resist removing step where the resist that is no longer necessary when the etching is completed is removed; a device assembly step (including a dicing process, a bonding process, and a packaging process); an inspection step; and the like. In this case, since the exposure apparatus of the embodiment above is used in the lithography step, the devices with high integration can be manufactured with good yield.

While the above-described embodiment of the present invention is the presently preferred embodiment thereof, those skilled in the art of lithography systems will readily recognize that numerous additions, modifications, and substitutions may be made to the above-described embodiment without departing from the spirit and scope thereof. It is intended that all such modifications, additions, and substitutions fall within the scope of the present invention, which is best defined by the claims appended below.

What is claimed is:

1. An exposure apparatus that exposes an object with an energy beam via an optical member and forms a pattern on the object, the apparatus comprising:
    a movable body that holds the object and is movable along a predetermined plane;
    a first encoder system which includes a first scale section that is placed, parallel to the predetermined plane, on one of the movable body and an intermediate member, and at least one first head that is arranged on the other of the movable body and the intermediate member and irradiates a measurement beam on the first scale section, and which measures a first positional relation between the movable body and the intermediate member in the predetermined plane based on an output of the at least one first head; and
    a second encoder system which includes a plurality of separate and spaced apart scales arranged on a lower surface of a barrel holding the optical member, parallel to the predetermined plane and having no portion farther outward than the barrel, and at least one second head that is arranged on the intermediate member and irradiates a measurement beam on at least one of the plurality of scales, and which measures a second positional relation between the optical member and the intermediate member in the predetermined plane based on an output of the at least one second head, wherein
    the movable body is driven based on the first positional relation and the second positional relation that have been measured.

2. The exposure apparatus according to claim 1, wherein the first encoder system measures the first positional relation related to two directions intersecting each other in the predetermined plane, and
the second encoder system measures the second positional relation related to two directions intersecting each other in the predetermined plane.

3. The exposure apparatus according to claim 2, wherein the first encoder system measures the first positional relation related to a first direction and a second direction intersecting each other in the predetermined plane, and
the second encoder system measures the second positional relation related to a third direction and a fourth direction intersecting each other in the predetermined plane.

4. The exposure apparatus according to claim 3, wherein the first direction and the second direction are orthogonal to each other, and
the third direction and the fourth direction are orthogonal to each other.

5. The exposure apparatus according to claim 4, wherein the first direction and the third direction intersect each other at a 45 degree angle.

6. The exposure apparatus according to claim 1, wherein the first scale section has a two-dimensional grating.

7. The exposure apparatus according to claim 1, wherein the first scale section is placed on the movable body, and the at least one first head is arranged on the intermediate member.

8. A device manufacturing method, comprising:
    a process of forming a pattern on an object by using the exposure apparatus according to claim 1; and
    a process of developing the object on which the pattern has been formed.

9. An exposure apparatus that exposes an object with an energy beam via an optical member, the apparatus comprising:
    a movable body that holds the object and is movable in a predetermined plane;
    a first encoder system which includes a first scale section that is placed, parallel to the predetermined plane, on one of the movable body and an intermediate member, and at least one first head that is arranged on the other of the movable body and the intermediate member and irradiates a measurement beam on the first scale section, and which measures a first positional relation between the movable body and the intermediate member in the predetermined plane based on an output of the at least one first head; and
    a second encoder system which includes a plurality of separate and spaced apart scales that are arranged on a lower surface of a barrel holding the optical member and are parallel to the predetermined plane, and at least two second heads that are arranged on the intermediate member and individually irradiate a measurement beam on the plurality of scales, and which measures a second positional relation between the optical member and the intermediate member in the predetermined plane based on outputs of the at least two second heads, wherein the movable body is driven based on the first positional relation and the second positional relation that have been measured.

10. The exposure apparatus according to claim 9, wherein the second encoder system measures positional relations in two directions intersecting each other and in a rotational direction in a plane parallel to the predetermined plane, as the second positional relation.

11. The exposure apparatus according to claim 9, wherein the second encoder system has two scales with different measurement directions arranged on the lower surface of the barrel and measures the second positional relation between the optical member and the intermediate member related to a first direction and a second direction intersecting each other in the predetermined plane, based on outputs of the at least two second heads.

12. A device manufacturing method, comprising:
a process of forming a pattern on an object by using the exposure apparatus according to claim 9; and
a process of developing the object on which the pattern has been formed.

13. An exposure method of exposing an object with an energy beam via an optical member and forming a pattern on the object, the method comprising:
measuring a first positional relation in a predetermined plane between a movable body that holds the object and is movable along the predetermined plane and an intermediate member, by using at least one first encoder head that irradiates a measurement beam on a first scale section and receives a light from the first scale section, the first scale section being placed, parallel to the predetermined plane, on one of the movable body and the intermediate member, and the at least one first encoder head being arranged on the other of the movable body and the intermediate member;
measuring a second positional relation between the optical member and the intermediate member in the predetermined plane, by using at least one second encoder head that irradiates a measurement beam on a second scale section comprising a plurality of separate and spaced apart scales, and receives a light from the second scale section, the second scale section being arranged on a lower surface of a barrel that holds the optical member, being parallel to the predetermined plane, and having no portion farther outward than the barrel, and the at least one second encoder head being arranged on the intermediate member; and
driving the movable body based on the first positional relation and the second positional relation that have been measured.

14. The exposure method according to claim 13, wherein
in the measuring the first positional relation, the first positional relation related to two directions intersecting each other in the predetermined plane is measured, and
in the measuring the second positional relation, the second positional relation related to two directions intersecting each other in the predetermined plane is measured.

15. The exposure method according to claim 14, wherein
in the measuring the first positional relation, the first positional relation related to a first direction and a second direction intersecting each other in the predetermined plane is measured, and
in the measuring the second positional relation, the second positional relation related to a third direction and a fourth direction intersecting each other in the predetermined plane is measured.

16. The exposure method according to claim 15, wherein
the first direction and the second direction are orthogonal to each other, and
the third direction and the fourth direction are orthogonal to each other.

17. The exposure method according to claim 16, wherein the first direction and the third direction intersect each other at a 45 degree angle.

18. The exposure method according to claim 13, wherein the first scale section has a two-dimensional grating.

19. The exposure method according to claim 13, wherein
the first scale section is placed on the movable body, and
the at least one first encoder head is arranged on the intermediate member.

20. A device manufacturing method, comprising:
a process of forming a pattern on an object by the exposure method according to claim 13; and
a process of developing the object on which the pattern has been formed.

21. An exposure method of exposing an object with an energy beam via an optical member, the method comprising:
measuring a first positional relation in a predetermined plane between a movable body that holds the object and is movable in the predetermined plane and an intermediate member, based on an output of at least one first encoder head that irradiates a measurement beam on a first scale section and receives a light from the first scale section, the first scale section being placed, parallel to the predetermined plane, on one of the movable body and the intermediate member, and the at least one first encoder head being arranged on the other of the movable body and the intermediate member;
measuring a second positional relation between the optical member and the intermediate member in the predetermined plane based on outputs of at least two second encoder heads that individually irradiate a measurement beam on a plurality of separate and spaced apart scales and receive a light from each of the plurality of scales, the plurality of scales being arranged on a lower surface of a barrel that holds the optical member and being parallel to the predetermined plane, and the at least two second encoder heads being arranged on the intermediate member; and
driving the movable body based on the first positional relation and the second positional relation that have been measured.

22. The exposure method according to claim 21, wherein
in the measuring the second positional relation, positional relations in two directions intersecting each other and in a rotational direction in a plane parallel to the predetermined plane are measured, as the second positional relation.

23. The exposure method according to claim 21, wherein
two scales having different measurement directions are arranged on the lower surface of the barrel, and
in the measuring the second positional relation, the second positional relation between the optical member and the intermediate member related to a first direction and a second direction intersecting each other in the predetermined plane is measured based on outputs of the at least two second encoder heads.

24. A device manufacturing method, comprising:
a process of forming a pattern on an object by the exposure method according to claim 21; and
a process of developing the object on which the pattern has been formed.

* * * * *

UNITED STATES PATENT AND TRADEMARK OFFICE
CERTIFICATE OF CORRECTION

| | | |
|---|---|---|
| PATENT NO. | : 8,792,079 B2 | Page 1 of 1 |
| APPLICATION NO. | : 12/343881 | |
| DATED | : July 29, 2014 | |
| INVENTOR(S) | : Yuichi Shibazaki | |

It is certified that error appears in the above-identified patent and that said Letters Patent is hereby corrected as shown below:

Title page, Item (56), add

U.S. 2006/0238731 A1     10/2006     Beems et al.

Signed and Sealed this
Eleventh Day of November, 2014

Michelle K. Lee
*Deputy Director of the United States Patent and Trademark Office*

UNITED STATES PATENT AND TRADEMARK OFFICE
CERTIFICATE OF CORRECTION

| | | |
|---|---|---|
| PATENT NO. | : 8,792,079 B2 | Page 1 of 1 |
| APPLICATION NO. | : 12/343881 | |
| DATED | : July 29, 2014 | |
| INVENTOR(S) | : Shibazaki | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 934 days.

Signed and Sealed this
Eighth Day of September, 2015

Michelle K. Lee
*Director of the United States Patent and Trademark Office*